United States Patent
Nam

(10) Patent No.: US 10,431,735 B2
(45) Date of Patent: Oct. 1, 2019

(54) ELECTRONIC DEVICE AND METHOD FOR FABRICATING THE SAME

(71) Applicant: SK hynix Inc., Icheon-Si (KR)

(72) Inventor: Ki-Won Nam, Seongnam-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/887,774

(22) Filed: Feb. 2, 2018

(65) Prior Publication Data

US 2018/0337328 A1   Nov. 22, 2018

(30) Foreign Application Priority Data

May 19, 2017  (KR) .................. 10-2017-0061968

(51) Int. Cl.
*H01L 43/12* (2006.01)
*H04L 27/22* (2006.01)
*H01L 43/08* (2006.01)
*G06F 3/06* (2006.01)
*H01L 43/10* (2006.01)
*H01L 27/22* (2006.01)

(52) U.S. Cl.
CPC .......... *H01L 43/12* (2013.01); *G06F 3/0619* (2013.01); *G06F 3/0656* (2013.01); *G06F 3/0659* (2013.01); *G06F 3/0673* (2013.01); *H01L 27/222* (2013.01); *H01L 43/08* (2013.01); *H01L 43/10* (2013.01)

(58) Field of Classification Search
CPC ......... H01L 43/08; H01L 43/10; H01L 43/12; H01L 45/1233; H01L 45/1253; H01L 45/1666; H01L 45/1675

See application file for complete search history.

(56) References Cited

U.S. PATENT DOCUMENTS

| 8,975,088 B2* | 3/2015 | Satoh ................. H01L 29/00 438/3 |
| 9,252,192 B2* | 2/2016 | Lee .................. H01L 45/1233 |
| 2014/0258626 A1* | 9/2014 | Kang ................. H01L 45/1253 711/125 |
| 2017/0092850 A1* | 3/2017 | Lee .................. H01L 43/12 |
| 2017/0098759 A1* | 4/2017 | Oh .................... H01L 43/02 |

FOREIGN PATENT DOCUMENTS

KR   10-2010-0076556   7/2010

* cited by examiner

*Primary Examiner* — Allison Bernstein
(74) *Attorney, Agent, or Firm* — Perkins Coie LLP

(57) ABSTRACT

An electronic device including a semiconductor memory. The semiconductor memory may include a variable resistance element exhibiting two different states for storing data; and an upper layer disposed over the variable resistance element, and wherein the upper layer may have a stepped or sloped profile and be located to serve as a part of a hard mask to pattern the variable resistance element.

13 Claims, 13 Drawing Sheets

ELECTRONIC DEVICE AND METHOD FOR FABRICATING THE SAME

CROSS-REFERENCE TO RELATED APPLICATION

This patent document claims priority of Korean Patent Application No. 10-2017-0061968, entitled "ELECTRONIC DEVICE AND METHOD FOR FABRICATING THE SAME" and filed on May 19, 2017, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device and a method for fabricating the same, in which an electronic device includes a semiconductor memory which can improve characteristics of a variable resistance element.

In one aspect, an electronic device may include a semiconductor memory, and the semiconductor memory may include a variable resistance element exhibiting two different states for storing data; and an upper layer disposed over the variable resistance element, and wherein the upper layer may have a stepped or sloped profile and be located to serve as a part of a hard mask to pattern the variable resistance element.

Implementations of the above electronic device may include one or more the following.

The upper layer may include a material having a high etching selectivity. The upper layer may include a single-layer or multilayer structure including a metal, a nitride, or an oxide, or a combination thereof. The upper layer may include ruthenium (Ru). The upper layer may include an upper portion and a lower portion having a wider width than the upper portion, and a height of the upper portion may be higher than a height of the lower portion. The variable resistance element may include an MTJ (Magnetic Tunnel Junction) structure including a free layer having a variable magnetization direction, a pinned layer having a fixed magnetization direction, and a tunnel barrier layer interposed between the free layer and the pinned layer, and the upper layer may be disposed over the MTJ structure and include a capping layer having the stepped or slopped profile. The capping layer may include an upper portion and a lower portion having a wider width than the upper portion, a height of the upper portion may be higher than a height of the lower portion, and the semiconductor memory may further include a top electrode disposed over the upper portion of the capping layer and having a smaller width than the upper portion. The capping layer may have an upper portion and a lower portion having a wider width than the upper portion, a height of the upper portion may be higher than a height of the lower portion, and the semiconductor memory may further include, a magnetic correction layer disposed over the MTJ structure and operable to offset or reduce an influence of a stray field produced by the pinned layer; a spacer layer interposed between the magnetic correction layer and the pinned layer and operable to function as a buffer between the magnetic correction layer and the pinned layer; an under layer disposed below the MTJ structure and operable to improve perpendicular magnetic anisotropy of the free layer; and a buffer layer disposed below the under layer and operable to aid in crystal growth of the under layer, wherein the magnetic correction layer, the spacer layer, the pinned layer, the tunnel barrier layer, the free layer, the under layer and the buffer layer may have sidewalls which are aligned with the lower portion of the capping layer, and the magnetic correction layer, the spacer layer, the pinned layer, the tunnel barrier layer, the free layer, the under layer and the buffer layer may have sidewalls which are not aligned with the upper portion of the capping layer. The semiconductor memory may further include, a magnetic correction layer disposed over the MTJ structure and operable to offset or reduce an influence of a stray field produced by the pinned layer; a spacer layer interposed between the magnetic correction layer and the pinned layer and operable to function as a buffer therebetween; an under layer disposed below the MTJ structure and operable to improve perpendicular magnetic anisotropy of the free layer; and a buffer layer disposed below the under layer and operable to aid in crystal growth of the under layer, wherein the magnetic correction layer, the spacer layer, the pinned layer, the tunnel barrier layer, the free layer, the under layer and the buffer layer may have sidewalls which are not aligned with the top electrode.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted from an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted from an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In another aspect, a method for fabricating an electronic device including a semiconductor memory may include: forming a material layer for a variable resistance element over a substrate; forming a material layer for an upper layer over the material layer for the variable resistance element; forming a hard mask pattern over the material layer for the upper layer; and performing an etch process such that the material layer for the upper layer has a stepped or sloped profile.

Implementations of the above method for fabricating the electronic device may include one or more the following.

The performing the etch process such that the material layer for the upper layer has a stepped or slopped profile may include: performing a high selectivity etch process not to cause any removal of the material layer for the upper layer and to form a polymer on a lower side surface of the hard mask pattern; performing an over-etch process with a low selectivity to partially remove the material layer for the upper layer; and repeating of performing of the high selectivity etch process and the over-etch process. The performing of the etch process may include depositing a polymer on a top surface and a side surface of the hard mask pattern. The material layer for the upper layer may include a material having a high etching selectivity. The material layer for the upper layer may include a single-layer or multilayer structure including a metal, a nitride or an oxide, or a combination thereof. The material layer for the upper layer may include ruthenium (Ru). The forming of the material layer for the variable resistance element provides an MTJ (Magnetic Tunnel Junction) structure including a free layer having a variable magnetization direction, a pinned layer having a fixed magnetization direction, and a tunnel barrier layer interposed between the free layer and the pinned layer. The method may further include forming a material layer for a top electrode over the material layer for the upper layer; and etching the material layer for the top electrode by using the hard mask patter as an etch barrier to form the top electrode. The material layer for the upper layer may include a capping layer including an upper portion and a lower portion having a wider width than the upper portion and a height of the upper portion is higher than a height of the lower portion. The top electrode may have a smaller width than the upper portion of the capping layer.

In still another aspect, a method for fabricating an electronic device including a semiconductor memory may include: forming a variable resistance element layer on a substrate to include a free layer having a variable magnetization direction, a pinned layer having a fixed magnetization direction, and a tunnel barrier layer interposed between the free layer and the pinned layer; forming a capping layer on the variable resistance element layer; forming a hard mask layer over the capping layer to pattern the capping layer; and performing a high selectivity etching and an over-etching to cause the capping layer to have a stepped or sloped sidewall.

Implementations of the above method for fabricating the electronic device may include one or more the following.

The performing of the high selectivity etching and the over-etching may include performing the high selectivity etching to minimize a loss of the capping layer and performing the over-etching to cause the loss of the capping layer. The performing of the high selectivity etching and the over-etching may include depositing a polymer on a side surface of the hard mask layer. The performing of the high selectivity etching and the over-etching may include repeating the performing of the high selectivity etching and the over-etching. The hard mask layer may include a conductive material including a metal. The capping layer may include an upper portion and a lower portion formed under the upper portion, the upper porting having a smaller width than the lower portion. The capping layer may include an upper portion and a lower portion formed under the upper portion and having a different width from that of the upper portion, the upper portion having a height higher than that of the lower portion.

These and other aspects, implementations and associated advantages are described in greater detail in the drawings, the description and the claims.

DETAILED DESCRIPTION

Figure 1A:
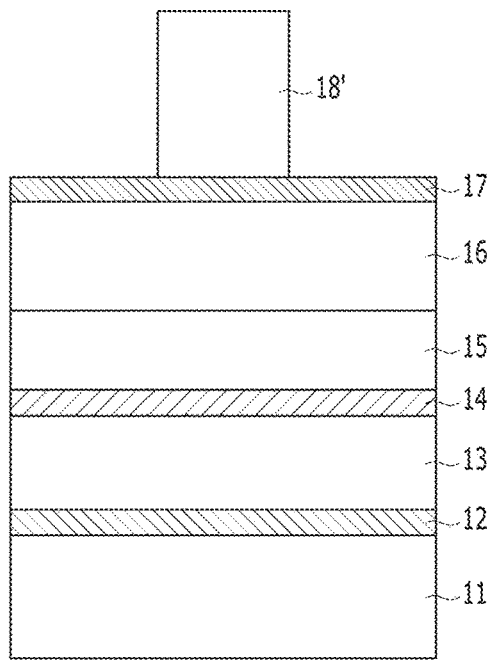
FIGS. 1A to 1C are cross-sectional views illustrating a method for fabricating a variable resistance element in accordance with a comparative example.

Various examples and implementations of the disclosed technology are described below in detail with reference to the accompanying drawings.

The drawings may not be necessarily to scale and in some instances, proportions of at least some of substrates in the drawings may have been exaggerated in order to clearly illustrate certain features of the described examples or implementations. In presenting a specific example in a drawing or description having two or more layers in a multi-layer substrate, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer substrate may not reflect all layers present in that particular multilayer substrate (e.g., one or more additional layers can be present between two illustrated layers). As a specific example, when a first layer in a described or illustrated multi-layer substrate is referred to as being "on" or "over" a second layer or "on" or "over" a substrate, the first layer may be directly formed on the second layer or the substrate but may also represent a substrate where one or more other intermediate layers may exist between the first layer and the second layer or the substrate.

Prior to explaining implementations of the present disclosure, a variable resistance element and a method for fabricating the same in accordance with a comparative example will be explained.

Figure 1B:
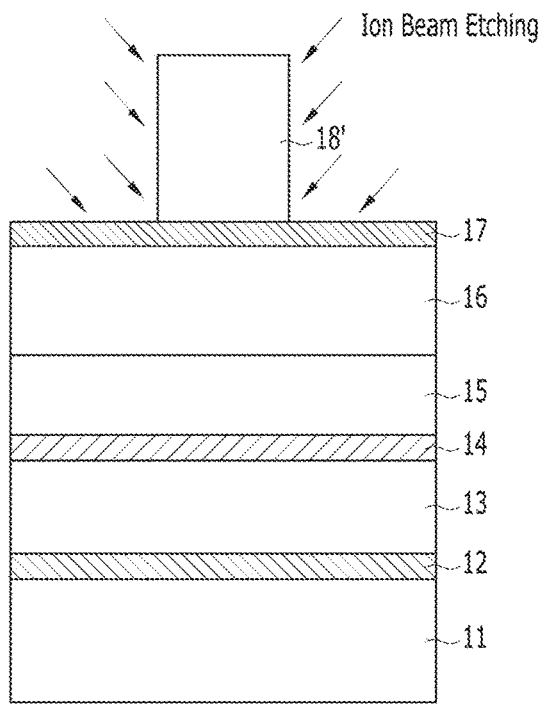
Figure 1C:
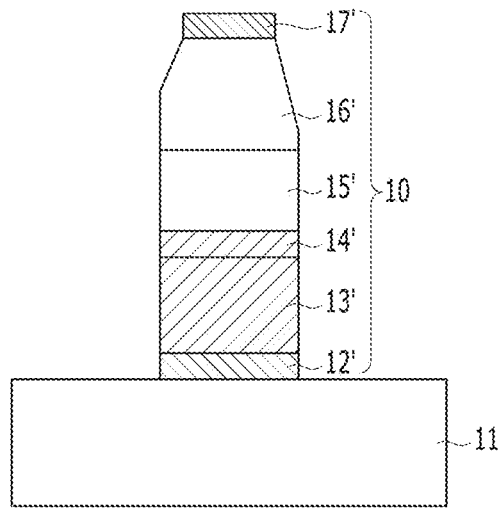

FIGS. 1A to 1C are cross-sectional views illustrating a method for fabricating a variable resistance element in accordance with a comparative example.

Referring to FIG. 1A, a conductive layer 12 for a bottom electrode may be formed over a substrate 11 where a predetermined structure (not shown) is formed.

A material layer 13 for a free layer, a material layer 14 for a tunnel barrier layer and a material layer 15 for a pinned layer may be sequentially formed over the conductive layer 12 for the bottom electrode.

A material layer 16 for a capping layer and a conductive layer 17 for a top electrode may be sequentially formed over the material layer 15 for the pinned layer.

A hard mask pattern 18' may be formed over the conductive layer 17 for the top electrode. The hard mask pattern 18' may be formed by forming a material layer for the hard mask pattern 18' and a photoresist pattern (not shown) over the conductive layer 17 for the top electrode, and etching the material layer for the hard mask pattern 18' by using the photoresist pattern as an etch barrier. Before forming the photoresist pattern, an anti-reflection layer (not shown) may be further formed over the material layer for the hard mask pattern 18' to prevent reflection during an exposure process.

Referring to FIG. 1B, the conductive layer 17 for the top electrode, the material layer 16 for the capping layer, the material layer 15 for the pinned layer, the material layer 14 for the tunnel barrier layer, the material layer 13 for the free layer and the conductive layer 12 for the bottom electrode may be sequentially etched by using the hard mask pattern 18' as an etch barrier.

This etch process may be performed through an ion beam etching (IBE) or sputtering. Since a material included in the hard mask pattern 18' has a low etch selectivity, the material cannot withstand the etch process, particularly when a device has a size smaller than a certain size. When the device has a size of 25 nm or less, an etch margin of the hard mask pattern 18' is decreased due to a decrease of the device size, which causes the hard mask pattern to collapse at some of their portions. In this case, a variable resistance element (see the reference numeral 10 of FIG. 1C) has a distorted profile. Further, since, during the etch process for forming the variable resistance element 10, the etching process is performed by adjusting an incident angle of ions, an attack on the side of the pattern causes a top portion and a side portion of the hard mask pattern 18' to be etched at the same time, resulting in a severe loss of the hard mask pattern 18'. Therefore, the rapid pattern collapse phenomenon in one direction is further intensified.

Referring to FIG. 1C, the variable resistance element 10 may include a bottom electrode 12', a free layer 13', a tunnel barrier layer 14', a pinned layer 15', a capping layer 16' and a top electrode 17'. However, as discussed above, in the comparative example of the variable resistance element, the rapid pattern collapse phenomenon in one direction occurs and the variable resistance element 10 has a distorted profile. This problem may occur more rapidly due to the shortage of the etch margin of the hard mask pattern 18' in case of reducing the device size, especially in case of a small pillar pattern of 25 nm or less. Such a distorted profile may deteriorate electrical characteristics of the variable resistance element 10.

A variable resistance element may mean an element capable of being switched between different resistance states in response to an applied bias (for example, a current or voltage). A resistance state of the variable resistance element may be changed by applying a voltage or current of a sufficient magnitude in a data write operation. The variable resistance element may have different resistance states of different resistance values for representing different data for data storage. Thus, the variable resistance element may store different data according to the resistance state. The variable resistance element may function as a memory cell. The memory cell may further include a selecting element coupled to the variable resistance element and controlling an access to the variable resistance element. Such memory cells may be arranged in various way to form a semiconductor memory.

In some implementations, the variable resistance element may include an MTJ (Magnetic Tunnel Junction) structure which includes a free layer having a variable magnetization direction, a pinned layer having a fixed magnetization direction and a tunnel barrier layer interposed therebetween. In response to a voltage or current of a sufficient amplitude applied to the variable resistance element, the magnetization direction of the free layer may be changed to a direction parallel or antiparallel to the magnetization direction of the pinned layer. Thus, the variable resistance element may switch between a low-resistance state and a high-resistance state to thereby store different data based on the different resistance states. The disclosed technology and its implementations can be used to provide an improved variable resistance element capable of satisfying or enhancing various characteristics required for the variable resistance element.

The disclosed technology provides some implementations in order to provide a variable resistance element which can prevent distortion of the profile due to the abrupt loss of a hard mask pattern by minimizing the loss at a top portion and a side portion of the hard mask pattern.

Figure 2:
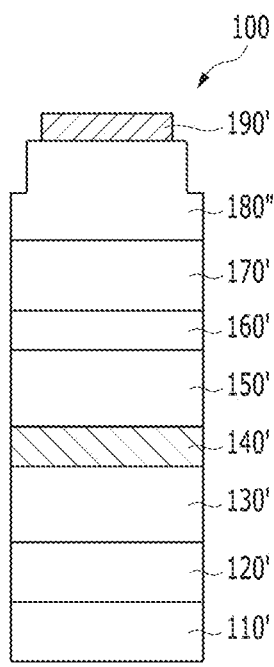
FIG. 2 is a cross-sectional view illustrating an exemplary variable resistance element in accordance with an implementation of the present disclosure.

FIG. 2 is a cross-sectional view illustrating an exemplary variable resistance element in accordance with an implementation of the present disclosure.

Referring to FIG. 2, a variable resistance element 100 in accordance with the implementation of the present disclosure may include an MTJ structure including a free layer 130' having a variable magnetization direction, a pinned layer 150' having a fixed magnetization direction, and a tunnel barrier layer 140' interposed between the free layer 130' and the pinned layer 150'.

The free layer 130' may have a variable magnetization direction that causes the MTJ structure to have a variable resistance value. With the change of the magnetization direction of the free layer 130', the relative relationship of the magnetization directions of the free layer 130' and the pinned layer 150' also changes, which allows the variable resistance element 100 to store different data or represent different data bits. The free layer 130' may also be referred as a storage layer or the like. The magnetization direction of the free layer 130' may be substantially perpendicular to a surface of the free layer 130', the tunnel barrier layer 140' and the pinned layer 150'. In other words, the magnetization direction of the free layer 130' may be substantially parallel to stacking directions of the free layer 130', the tunnel barrier layer 140' and the pinned layer 150'. Therefore, the magnetization direction of the free layer 130' may be changed between a downward direction and an upward direction. The change in the magnetization direction of the free layer 130' may be induced by spin transfer torque.

The free layer 130' may have a single-layer or multilayer structure including a ferromagnetic material. For example, the free layer 130' may include an alloy based on Fe, Ni or Co, for example, an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, or a Co—Fe—B alloy, or the like, or may include a stack of metals, such as Co/Pt, or Co/Pd, or the like.

The tunnel barrier layer 140' may allow the tunneling of electrons in both data reading and data writing operations. In a write operation for storing new data, a high write current may be directed through the tunnel barrier layer 140' to change the magnetization direction of the free layer 130' and thus to change the resistance state of the MTJ for writing a new data bit. In a reading operation, a low reading current may be directed through the tunnel barrier layer 140' without changing the magnetization direction of the free layer 130' to measure the existing resistance state of the MTJ under the existing magnetization direction of the free layer 130' to read the stored data bit in the MTJ. The tunnel barrier layer 140' may include a dielectric oxide, for example, an oxide such as MgO, CaO, SrO, TiO, VO, or NbO or the like.

The pinned layer 150' may have a pinned magnetization direction which contrasts with the magnetization direction of the free layer 130', and may be referred to as a reference layer or the like. In some implementations, the magnetization direction of the pinned layer 150' may be pinned in a downward direction. In some implementations, the magnetization direction of the pinned layer 150' may be pinned in an upward direction.

The pinned layer 150' may have a single-layer or multilayer structure including a ferromagnetic material. For example, the pinned layer 150' may include an alloy based on Fe, Ni or Co, for example, an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, or a Co—Fe—B alloy or the like, or may include a stack of metals, such as Co/Pt, or Co/Pd or the like.

If a voltage or current is applied to the variable resistance element 100, the magnetization direction of the free layer 130' may be changed by spin torque transfer. When the magnetization directions of the free layer 130' and the pinned layer 150' are parallel to each other, the variable resistance element 100 may be in a low resistance state to store a particular designated digital data bit such as '0'. Conversely, when the magnetization directions of the free layer 130' and the pinned layer 150' are anti-parallel to each other, the variable resistance element 100 may be in a high resistance state to store a different designated digital data bit such as '1'. In some implementations, the variable resistance element 100 can be configured to store data bit '1' when the magnetization directions of the free layer 130' and the pinned layer 150' are parallel to each other and to store data bit '0' when the magnetization directions of the free layer 130' and the pinned layer 150' are anti-parallel to each other.

In some implementations, the variable resistance element 100 may further include one or more layers performing various functions to improve a characteristic of the MTJ structure. For example, the variable resistance element 100 may further include a buffer layer 110', an under layer 120', a spacer layer 160', a magnetic correction layer 170', a capping layer 180" and a top electrode 190'.

The buffer layer 110' may be disposed under the under layer 120' and aid in crystal growth of the under layer 120'. When the buffer layer 110' is formed under the under layer 120', it is possible to aid in crystal growth of the under layer 120' and thus improve perpendicular magnetic crystalline anisotropy of the free layer 130'. The buffer layer 110' may have a single-layer or multilayer structure including a metal, a metal alloy, a metal nitride, or a metal oxide, or a combination thereof.

The under layer 120' may be disposed under the free layer 130' and serve to improve perpendicular magnetic crystalline anisotropy of the free layer 130'.

The under layer 120' may have a single-layer or multi-layer structure including a metal, a metal alloy, a metal nitride, or a metal oxide, or a combination thereof.

The magnetic correction layer 170' may serve to offset the effect of the stray magnetic field produced by the pinned layer 150'. In this case, the effect of the stray magnetic field of the pinned layer 150' can decrease, and thus a biased magnetic field in the free layer 130' can decrease. The magnetic correction layer 170' may have a magnetization direction anti-parallel to the magnetization direction of the pinned layer 150'. In the implementation, when the pinned layer 150' has a downward magnetization direction, the magnetic correction layer 170' may have an upward magnetization direction. Conversely, when the pinned layer 150' has an upward magnetization direction, the magnetic correction layer 170' may have a downward magnetization direction. The magnetic correction layer 170' may have a single-layer or multilayer structure including a ferromagnetic material.

In this implementation, the magnetic correction layer 170' is located above the pinned layer 150', but the position of the magnetic correction layer 170' may be changed. For example, the magnetic correction layer 170' may also be located above, below, or next to the MTJ structure while it is patterned separately from the MTJ structure.

The spacer layer 160' may be interposed between the magnetic correction layer 170' and the pinned layer 150' and function as a buffer between the magnetic correction layer 170' and the pinned layer 150'. The spacer layer 160' may serve to improve characteristics of the magnetic correction layer 170'. The spacer layer 160' may include a noble metal such as ruthenium (Ru).

The capping layer 180" may function as a hard mask for patterning the variable resistance element 100. In some implementations, the capping layer 180" may include various conductive materials such as a metal. In some implementations, the capping layer 180" may include a metallic material having almost none or a small number of pin holes and high resistance to wet and/or dry etching. In some implementations, the capping layer 180" may include a metal, a nitride or an oxide, or a combination thereof. For example, the capping layer 180" may include a noble metal such as ruthenium (Ru).

The top electrode 190' may act as a conductive line of the variable resistance element 100 and also function as a part of a hard mask to pattern the variable resistance element 100. The top electrode 190' may have a single-layer or multilayer structure including a conductive material such as a metal. For example, the top electrode 190' may include tungsten (W).

As shown in FIG. 2, in this implementation, the variable resistance element 100 may have a stepped profile. For example, a width of the top electrode 190' may be smaller than a width of a top surface of the capping layer 180". Moreover, the capping layer 180" may have a stepped profile and include an upper portion and a lower portion having a wider width than the upper portion. In some implementations, a height of the upper portion may be higher than a height of the lower portion. Further, a width of the magnetic correction layer 170', a width of the spacer layer 160', a width of the pinned layer 150', a width of the tunnel barrier layer 140', a width of the free layer 130', a width of the under layer 120' and a width of the buffer layer 110' may be substantially the same as each other. Each of the widths of the layers 170', 160', 150', 140', 130', 120' and 110' may be greater than a width of the upper portion of the capping layer 180" and be substantially the same as a width of the lower portion of the capping layer 180". As such, in the present implementations, the profile of the variable resistance element 100 is formed in a stepped shape. Such stepped shape profile of the variable resistance element allows the configuration of the element to be stably maintained, especially when the element has a size of 25 nm or less, which will be discussed later of this document. Therefore, it is possible to prevent distortion of electrical characteristics of the variable resistance element 100.

In this implementations, it has described that the capping layer 180" has a stepped profile. Other implementations are also possible. For example, in some implementations, the capping layer 180" may have a sloped profile.

In the variable resistance element 100 in accordance with the above implementation, the free layer 130' is formed below the pinned layer 150'. Other implementations are also possible such that the free layer 130' can be formed above the pinned layer 150'.

A method for fabricating a variable resistance element in accordance with an implementation will be exemplarily explained with reference to FIGS. 3A to 3F.

FIGS. 3A to 3F are cross-sectional views illustrating a variable resistance element and a method for fabricating the same in accordance with an implementation of the present disclosure. The layers of the variable resistance element have the materials and structures as discussed with regard to FIG. 2.

Figure 3A:
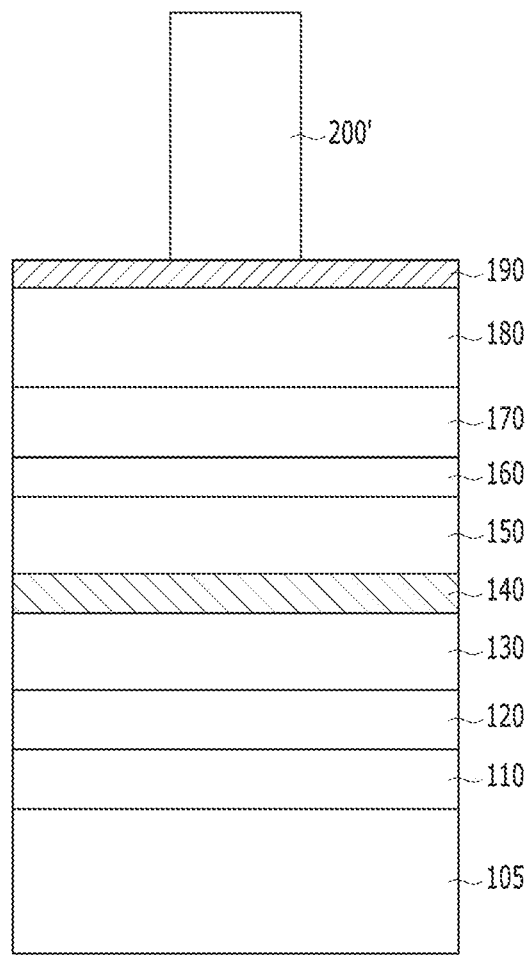
FIGS. 3A to 3F are cross-sectional views illustrating an exemplary variable resistance element and a method for fabricating the same in accordance with an implementation of the present disclosure.

Referring to FIG. 3A, a material layer 110 for a buffer layer may be formed over a substrate 105 where a predetermined structure (not shown) is formed. The material layer 110 for the buffer layer may be formed of or include a material having a good compatibility with a bottom electrode (not shown) in order to resolve the lattice constant mismatch between the bottom electrode and an under layer (see the reference numeral 120' of FIG. 3F). For example, the material layer 110 for the buffer layer may include tantalum (Ta).

A material layer 120 for an under layer may be formed over the material layer 110 for the buffer layer.

A material layer 130 for a free layer, a material layer 140 for a tunnel barrier layer and a material layer 150 for a pinned layer may be sequentially formed over the material layer 120 for the buffer layer.

A material layer 160 for a spacer layer may be formed over the material layer 150 for the pinned layer.

A material layer 170 for a magnetic correction layer may be formed over the material layer 160 for the spacer layer.

A material layer 180 for a capping layer may be formed over the material layer 170 for the magnetic correction layer.

A material layer 190 for a top electrode may be formed over the material layer 180 for the capping layer.

A hard mask pattern 200' may be formed over the material layer 190 for the top electrode. The hard mask pattern 200' may be formed by forming a material layer for the hard mask pattern 200' and a photoresist pattern (not shown) over the material layer 190 for the top electrode and etching the material layer for the hard mask pattern 200' by using the photoresist pattern as an etch barrier. Before forming the photoresist pattern, an anti-reflection layer (not shown) may be further formed over the material layer for the hard mask pattern 200' in order to prevent reflection during an exposure process.

The material layer for the hard mask pattern 200' may have a single-layer or multilayer structure including carbon.

In this implementation, both of the material layer 190 for the top electrode and the material layer for the hard mask pattern 200' are formed separately from each other. However, in other implementations, the material layer 190 for the top electrode may be omitted and the material layer for the hard mask pattern 200' may be formed to include a conductive layer including a metal. In this case, the hard mask pattern 200' may be used as a top electrode.

Figure 3B:
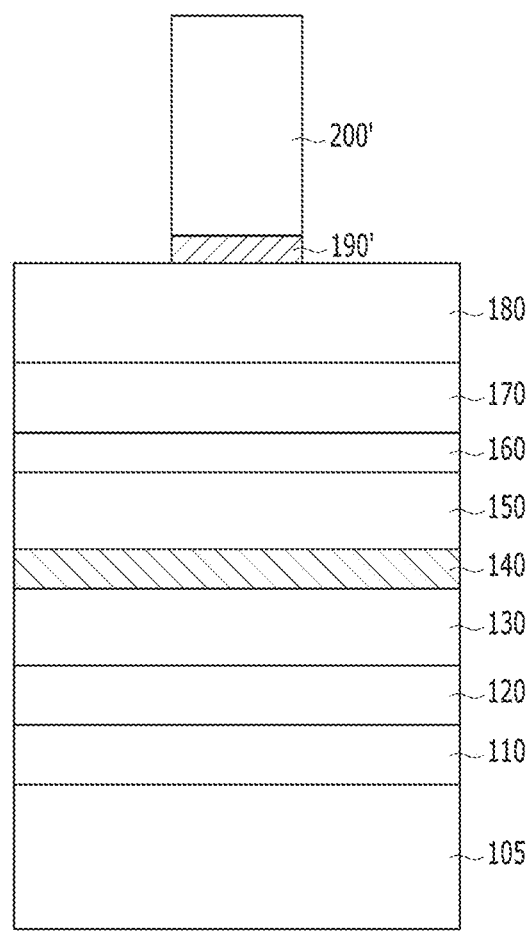

Referring to FIG. 3B, the material layer 190 for the top electrode may be etched by using the hard mask pattern 200' as an etch barrier to form a top electrode 190' and open the material layer 180 for the capping layer. Here, the etch process may be performed under a condition where there is no or minimal loss of the material layer 180 for the capping layer. For example, the etch process may be performed at a high selectivity condition that causes no or minimal loss of the material layer 180 for a capping layer.

Figure 3C:
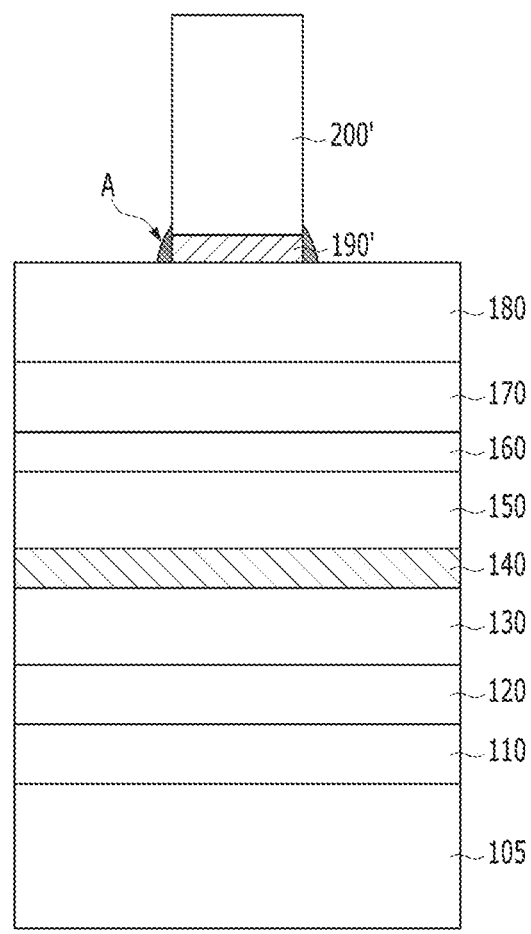

Referring to FIG. 3C, during the high-selectivity etching, a polymer is deposited on the side surfaces of the top electrode 190' and the hard mask pattern 200'. In FIG. 3C, a polymer layer A may be formed to a certain thickness on a lower side surface of the hard mask pattern 200' and a side surface of the top electrode 190' without loss of the material layer 180 for the capping layer.

The polymer layer A is formed on the lower side surface of the hard mask pattern 200' and the side surface of the top electrode 190' to minimize the loss of a contact part of the hard mask pattern 200' and the top electrode 190' with an top portion of the MTJ structure. The areas where the polymer layer A is formed, i.e., the lower side surface of the hard mask pattern 200' and the side surface of the top electrode 190,' are decided based on a fact that an angle of incidence of an ion during an MTJ etching in a subsequent process is high in the areas.

In other implementations, when the material layer 190 for a top electrode is omitted and the material layer for the hard mask pattern 200' is formed to include a conductive material including a metal, the polymer layer A may be formed to a certain thickness on the lower side surface of the hard mask pattern 200' by performing the etch process with a high selectivity as described above.

Figure 3D:
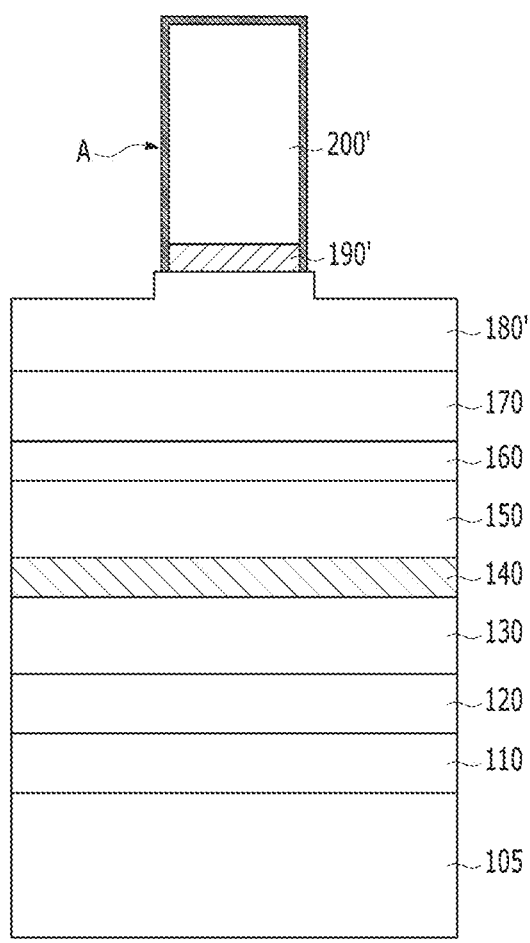

Referring to FIG. 3D, an over-etch process may be performed on the resultant structure so that the material layer 180 for the capping layer is removed to a certain height. The over-etch process may be performed by decreasing the selectivity to cause a loss of the material layer 180 for the capping layer. For example, the over-etch process may be performed through a plasma reactive ion etching. The material layer 180 for the capping layer may be partially etched to a certain height by the over-etch process. The material layer 180 for the capping layer which is partially etched is referred to as reference number 180'.

The high selectivity etch process may be performed again on the resultant structure under a condition where there is no or minimal loss of the material layer 180 for the capping layer. By the high selectivity etch process, polymer is deposited on the lower side surface of the hard mask pattern 200' and the side surface of the top electrode 190' to form the polymer layer A. At the same time, a profile of the etched portion of the material layer 180' for the capping layer may be induced to be vertical so that it is possible to secure a uniform profile of the MTJ when etching the MTJ in a subsequent process.

Then, the over-etch process may be performed again on the resultant structure such that the material layer 180 for the capping layer is partially etched to a certain height.

As such, by repeatedly performing the high selectivity etch process and the over-etch process, it is possible to form the polymer A on a top surface and a side surface of the hard mask pattern 200' and on the side surface of the top electrode 190', and to make the material layer 180' for the capping layer have a stepped profile with a certain height.

Figure 3E:
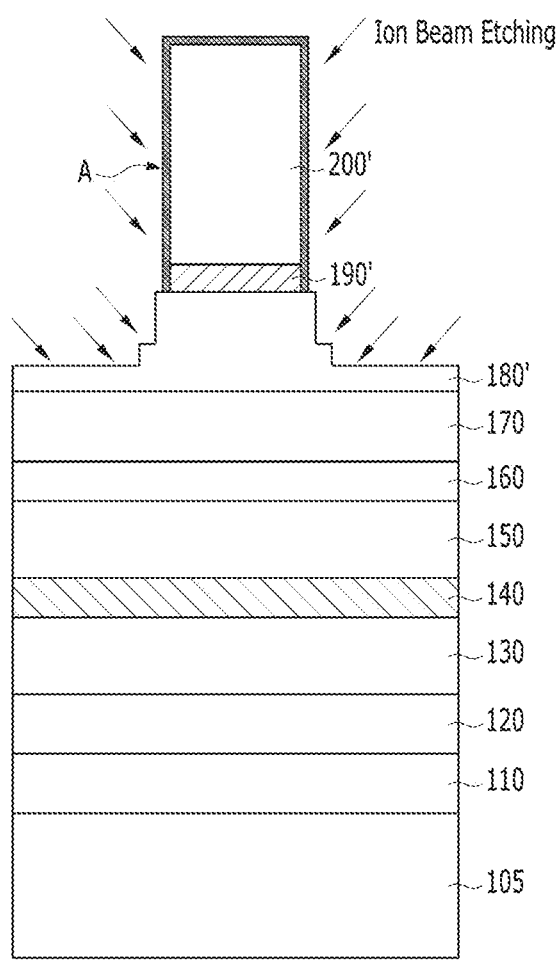

Referring to FIG. 3E, the polymer A may be formed over a top surface and a side surface of the hard mask pattern 200' and on the side surface of the top electrode 190', and the material layer 180' for a capping layer may have a stepped profile with a certain height. In this implementation, the material layer 180' for the capping layer has a stepped profile. In other implementations, the material layer 180' for the capping layer may have a sloped profile.

In other implementations, when the material layer 190 for the top electrode is omitted and the material layer for the hard mask pattern 200' is formed to include conductive material including a metal, by repeatedly performing the high selectivity etch process and the over-etch process, the polymer layer A may be formed on a top surface and a side surface of the hard mask pattern 200' and the material layer 180' for the capping layer may have a stepped or sloped profile with a certain height.

Then, the remaining material layer 180' for the capping layer, the material layer 170 for the magnetic correction layer, the material layer 160 for the spacer layer, the material layer 150 for the pinned layer, the material layer 140 for the tunnel barrier layer, the material layer 130 for the free layer, the material layer 120 for the under layer and the material layer 110 for the buffer layer may be sequentially etched by using the hard mask pattern 200', the top electrode 190' and the polymer layer A as a etch barrier. The etch process may be performed through a physical etch process such as IBE or the like.

In such an etch process, the polymer A formed on the top surface and side surface of the hard mask pattern 200' and on the side surface of the top electrode 190' can protect a top portion and a side portion of the hard mask pattern 200', which results in increasing the selectivity for the hard mask pattern 200' and the top electrode 190'. Further, the stepped or sloped profile of the material layer 180' for the capping layer may be partially transferred to a part disposed below the material layer 180' to prevent abrupt collapse of the pattern. As a result, it is possible to secure a uniform profile of a variable resistance element 100.

Figure 3F:
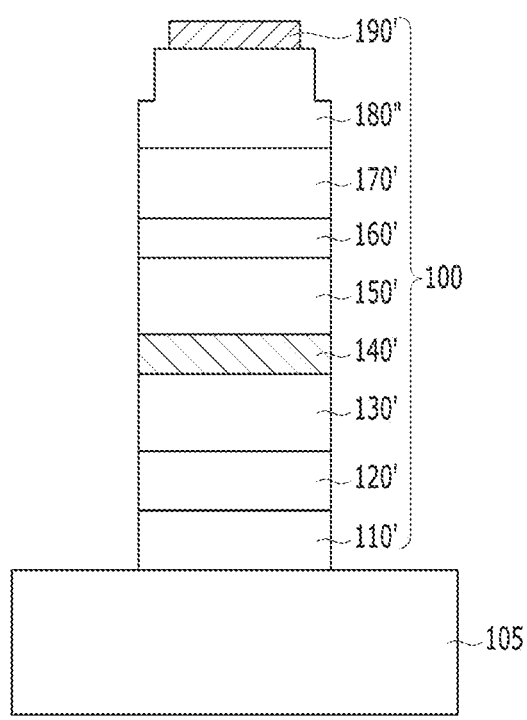

Referring to FIG. 3F, the variable resistance element 100 may be formed over the substrate 105, and the variable resistance element 100 may include a buffer layer 110', an under layer 120', a free layer 130', a tunnel barrier layer 140', a pinned layer 150', a spacer layer 160', a magnetic correction layer 170', a capping layer 180" and a top electrode 190'.

The variable resistance element 100 may have a stepped profile. A width of the top electrode 190' may be smaller than a width of an upper portion of the capping layer 180". Moreover, the capping layer 180" may have a stepped profile having an upper portion and a lower portion having a wider width than the upper portion. A height of the upper portion may be higher than a height of the lower portion. Moreover, a width of the magnetic correction layer 170', a width of the spacer layer 160', a width of the pinned layer 150', a width of the tunnel barrier layer 140', a width of the free layer 130', a width of the under layer 120' and a width of the buffer layer 110' may be substantially the same as each other. And, each of the widths of the layers 170', 160', 150', 140', 130', 120' and 110' may be greater than a width of the upper portion of the capping layer 180" and be substantially the same as a width of the lower portion of the capping layer 180".

As such, in the present implementations, since the profile of the variable resistance element 100 is formed in a stepped shape, pattern collapse in one direction can be prevented and the configuration of the element can be stably maintained, especially when the element has a size of 25 nm or less. Therefore, it is possible to prevent distortion of electrical characteristics of the variable resistance element 100.

In this implementations, the capping layer 180" has a stepped profile. Alternatively, in other implementations, the capping layer 180" may have a sloped profile.

Also, in this implementation, when the material layer 190 for the top electrode is formed of or includes a stack structure of tungsten (W)/titanium nitride (TiN), by performing the etch process as described above with reference to FIG. 3E, TiN disposed at an upper portion may be removed and the top electrode 190' may include tungsten (W).

In this implementation, the hard mask pattern 200' is removed. In other implementation, the material layer 190 for the top electrode is omitted and the material layer for the hard mask pattern 200' is formed of or includes a conductive layer including a metal, the hard mask pattern 200' may remain over the capping layer 180" having a stepped or sloped profile to function as a top electrode.

A semiconductor memory device as disclosed in this document may include a cell array of variable resistance elements 100 to store data. The semiconductor memory may further include various components such as lines, elements, etc. to drive or control each variable resistance element 100. This is exemplarily explained with reference to FIGS. 4 and 5.

Figure 4:
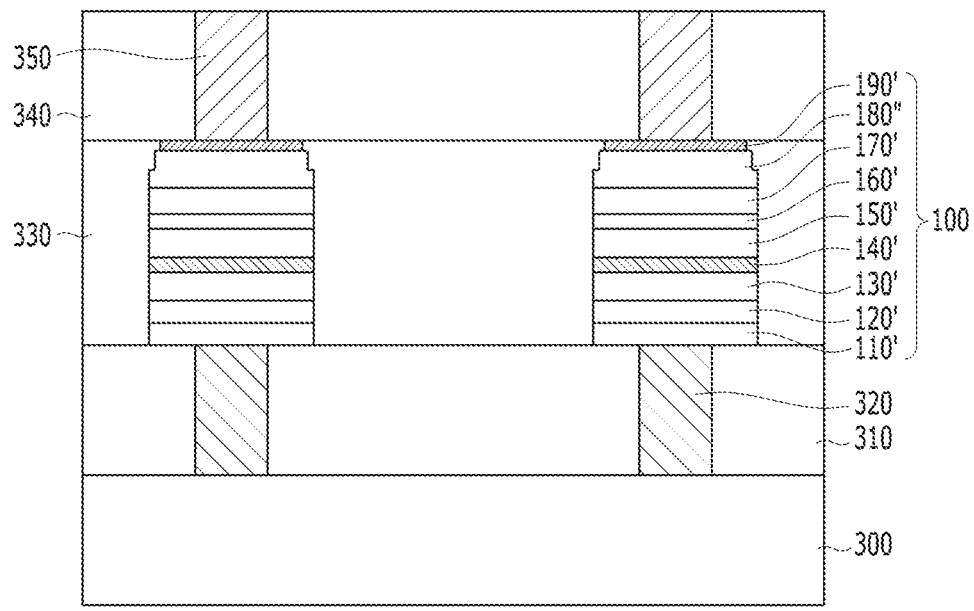
FIG. 4 is a cross-sectional view for explaining an exemplary memory device and a method for fabricating the same in accordance with an implementation of the present disclosure.

FIG. 4 is a cross-sectional view for explaining a memory device and a method for fabricating the same in accordance with an implementation of the present disclosure.

Referring to FIG. 4, the memory device of the implementation may include a substrate 300, lower contacts 320 formed over the substrate 300, variable resistance elements 100 formed over the lower contacts 320 and upper contacts 350 formed over the variable resistance element 100. For each variable resistance element 100, a specific structure as a switch or switching circuit/element, for example, a transistor, for controlling an access to a particular variable resistance element 100 can be provided over the substrate 300 to control the variable resistance element 100, where the switch can be turned on to select the variable resistance element 100 or turned off to de-select the variable resistance element 100. The lower contacts 320 may be disposed over the substrate 300, and couple a lower end of the variable resistance element 100 to a portion of the substrate 300, for example, a drain of the transistor as the switching circuit for the variable resistance element 100. The upper contact 350 may be disposed over the variable resistance element 100, and couple an upper end of the variable resistance element 100 to a certain line (not shown), for example, a bit line. In FIG. 4, two variable resistance elements 100 are shown as examples of the elements in an array of variable resistance elements 100. As shown in FIG. 4, the variable resistance elements 100 include the capping layer 180" having a stepped profile as discussed with regard to FIGS. 3A-3F.

The above memory device may be fabricated by following processes.

First, the substrate 300 in which the transistor or the like is formed may be provided, and then, a first interlayer dielectric layer 310 may be formed over the substrate 300. Then, the lower contact 320 may be formed by selectively etching the first interlayer dielectric layer 310 to form a hole H exposing a portion of the substrate 300 and filling the hole H with a conductive material. Then, the variable resistance element 100 may be formed by forming material layers for the variable resistance element 100 over the first interlayer dielectric layer 310 and the lower contact 320, and selectively etching the material layers. The etch process for forming the variable resistance element 100 may include the IBE method which has a strong physical etching characteristic. Then, a second interlayer dielectric layer 330 may be formed to cover the variable resistance element. Then, a third interlayer dielectric layer 340 may be formed over the variable resistance element 100 and the second interlayer dielectric layer 330, and then upper contacts 350 passing through the third interlayer dielectric layer 340 and coupled to an upper end of the variable resistance element 100 may be formed.

In the memory device in accordance with this implementation, all layers forming the variable resistance element 100 may have sidewalls which are aligned with one another. That is because the variable resistance element 100 is formed through an etch process using one mask.

Unlike the implementation of FIG. 4, a part of the variable resistance element 100 may be patterned separately from other parts. This process is illustrated in FIG. 5.

Figure 5:
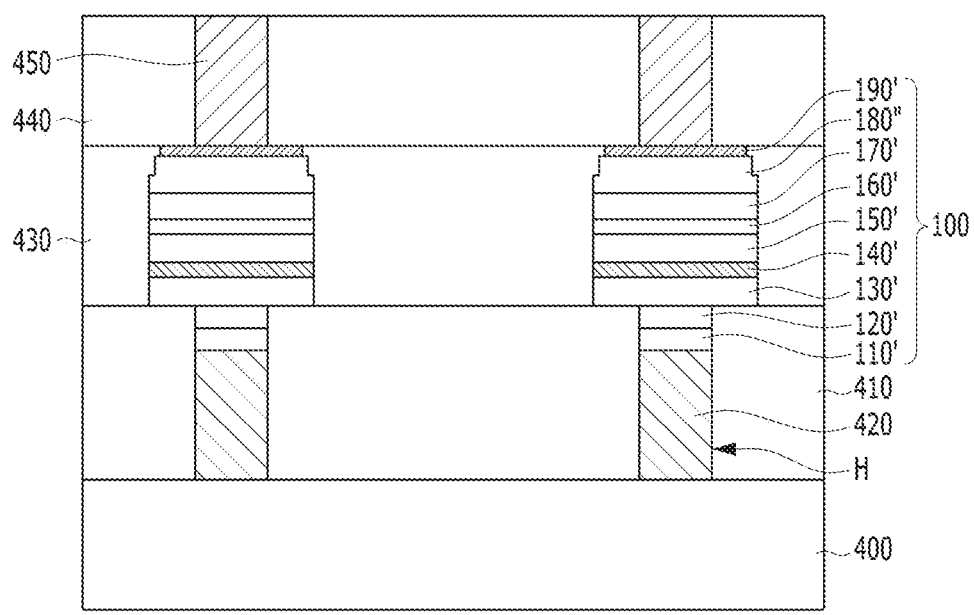
FIG. 5 is a cross-sectional view for explaining an exemplary memory device and a method for fabricating the same in accordance with another implementation of the present disclosure.

FIG. 5 is a cross-sectional view for explaining a memory device and a method for fabricating the same in accordance with another implementation of the present disclosure. The following descriptions will be focused on a difference from the implementation of FIG. 4.

Referring to FIG. 5, the memory device in accordance with this implementation may include a variable resistance element 100 of which parts, for example, a buffer layer 110' and a under layer 120' have sidewalls that are not aligned with other layers thereof. As shown in FIG. 5, the buffer layer 110' and the under layer 120' may have sidewalls which are aligned with lower contacts 520.

The memory device in FIG. 5 may be fabricated by following processes.

First, a first interlayer dielectric layer 410 may be formed over a substrate 400, and then selectively etched to form a hole H exposing a portion of the substrate 400. The, the lower contacts 420 may be formed to fill a lower portion of the hole H. For example, the lower contacts 420 may be formed through a series of processes of forming a conductive material to cover the resultant structure having the hole formed therein, and removing a part of the conductive material through an etch back process or the like until the conductive material has a desired thickness. Then, the buffer layer 110' and an under layer 120' may be formed so as to fill the remaining portion the hole H. For example, the buffer layer 110' may be formed by forming a material layer for forming the buffer layer 110' which covers the resultant structure in which the lower contacts 420 is formed, and then removing a portion of the material layer by, for example, an etch-back process until the material layer has a desired thickness. Moreover, the under layer 120' may be formed by forming a material layer for forming the under layer 120' which covers the resultant structure in which the lower contacts 420 and the buffer layer 110' are formed, and then performing a planarization process such as a CMP (Chemical Mechanical Planarization) until a top surface of the first interlayer dielectric layer 410 is exposed. Then, the remaining parts of the variable resistance element 100 may be formed by forming material layers for forming the remaining layers of the variable resistance element 100 except the buffer layer 110' and the under layer 120' over the lower contacts 420 and the first interlayer dielectric layer 410. As shown in FIG. 5, the variable resistance elements 100 include the capping layer 180" having a stepped profile as discussed with regard to FIGS. 3A-3F.

Subsequent processes are substantially the same as those as shown in FIG. 4.

In this implementation, the height which needs to be etched at a time in order to form the variable resistance element 100 can be reduced, which makes it possible to lower the difficulty level of the etch process.

Although in this implementation, the buffer layer 110' and the under layer 120' are buried in the hole H, other parts of the variable resistance element 100 may also be buried as needed.

The above and other memory circuits or semiconductor devices based on the disclosed technology can be used in a range of devices or systems. FIGS. 6 to 10 provide some examples of devices or systems that can implement the memory circuits disclosed herein.

Figure 6:
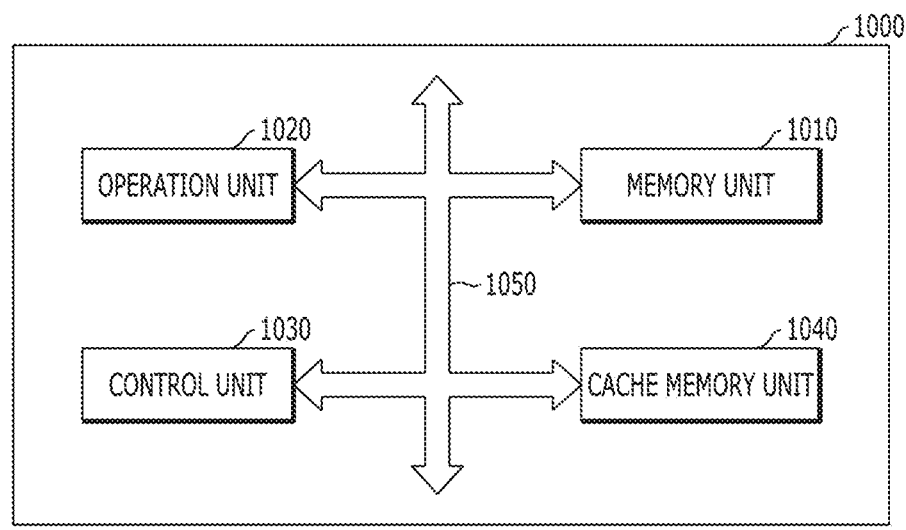
FIG. 6 is an example of configuration diagram of a microprocessor implementing memory circuitry based on the disclosed technology.

FIG. 6 is an example of configuration diagram of a microprocessor implementing memory circuitry based on the disclosed technology.

Referring to FIG. 6, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a variable resistance element exhibiting two different states for storing data; and an upper layer disposed over the variable resistance element, and wherein the upper layer may have a stepped or sloped profile and be located to serve as a part of a hard mask to pattern the variable resistance element. Through this, data storage characteristics of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to this implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 7:
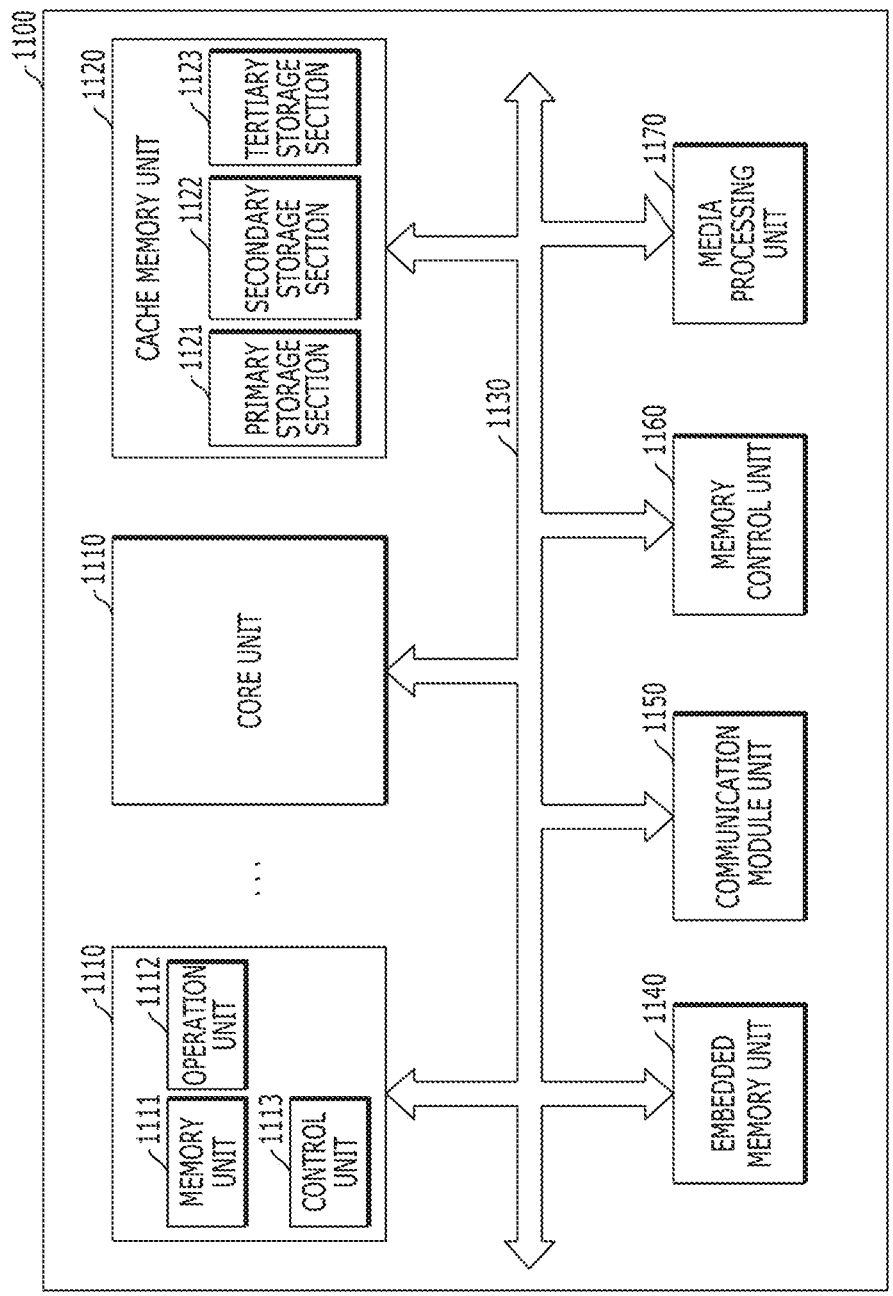
FIG. 7 is an example of configuration diagram of a processor implementing memory circuitry based on the disclosed technology.

FIG. 7 is an example of configuration diagram of a processor implementing memory circuitry based on the disclosed technology.

Referring to FIG. 7, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of this implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a variable resistance element exhibiting two different states for storing data; and an upper layer disposed over the variable resistance element, and wherein the upper layer may have a stepped or sloped profile and be located to serve as a part of a hard mask to pattern the variable resistance element. Through this, data storage characteristics of the cache memory unit 1120 may be improved. As a consequence, operating characteristics of the processor 1100 may be improved.

Although it was shown in FIG. 7 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to this implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to this implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 8:
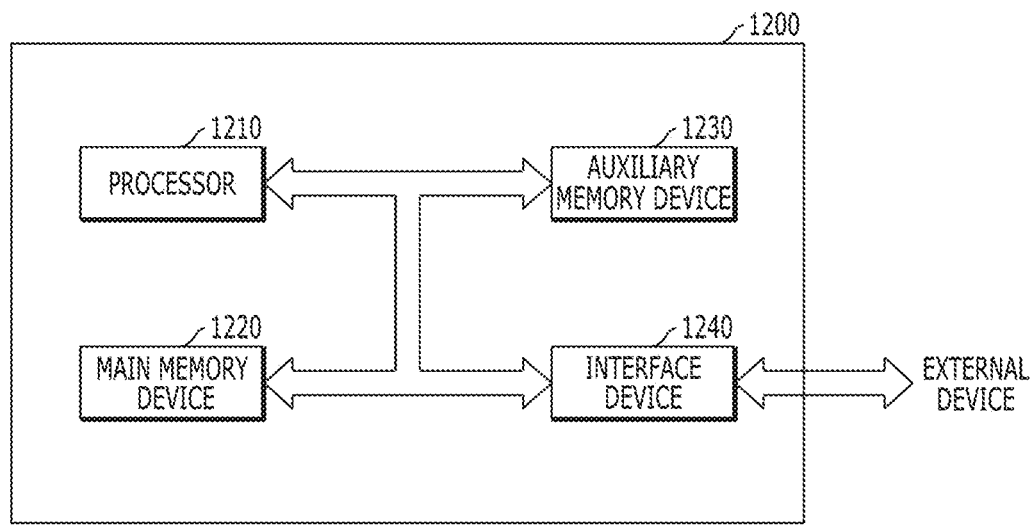
FIG. 8 is an example of configuration diagram of a system implementing memory circuitry based on the disclosed technology.

FIG. 8 is an example of configuration diagram of a system implementing memory circuitry based on the disclosed technology.

Referring to FIG. 8, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of this implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a variable resistance element exhibiting two different states for storing data; and an upper layer disposed over the variable resistance element, and wherein the upper layer may have a stepped or sloped profile and be located to serve as a part of a hard mask to pattern the variable resistance element. Through this, data storage characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a variable resistance element exhibiting two different states for storing data; and an upper layer disposed over the variable resistance element, and wherein the upper layer may have a stepped or sloped profile and be located to serve as a part of a hard mask to pattern the variable resistance element. Through this, data storage characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 9) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 9) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of this implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 9:
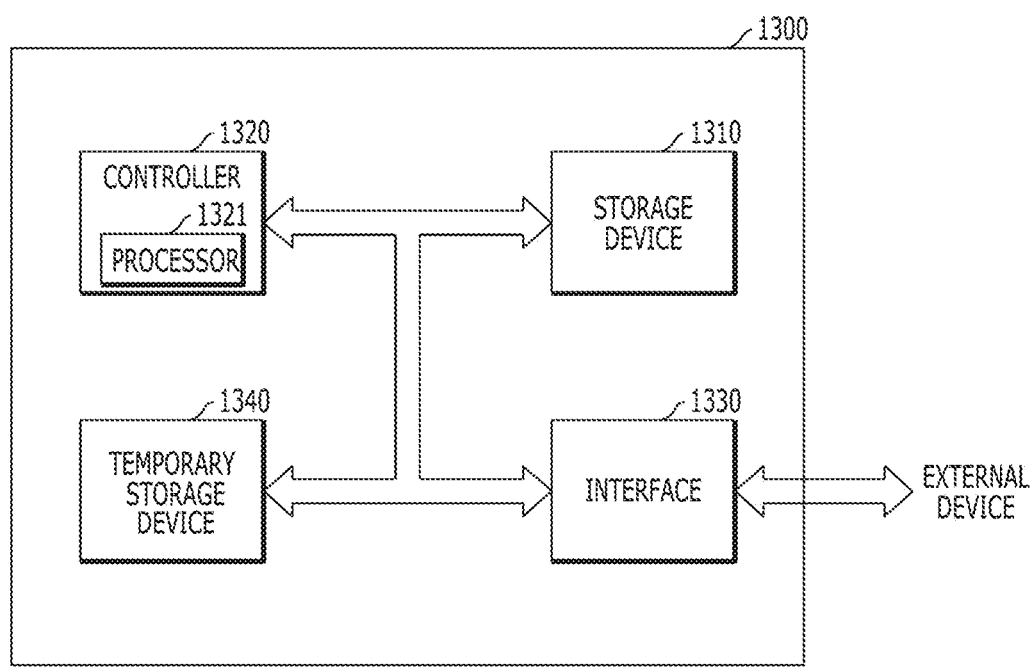
FIG. 9 is an example of configuration diagram of a data storage system implementing memory circuitry based on the disclosed technology.

FIG. 9 is an example of configuration diagram of a data storage system implementing memory circuitry based on the disclosed technology.

Referring to FIG. 9, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a variable resistance element exhibiting two different states for storing data; and an upper layer disposed over the variable resistance element, and wherein the upper layer may have a stepped or sloped profile and be located to serve as a part of a hard mask to pattern the variable resistance element. Through this, data storage characteristics of the storage device 1310 or the temporary storage device 1340 may be improved. As a consequence, operating characteristics and data storage characteristics of the data storage system 1300 may be improved.

Figure 10:
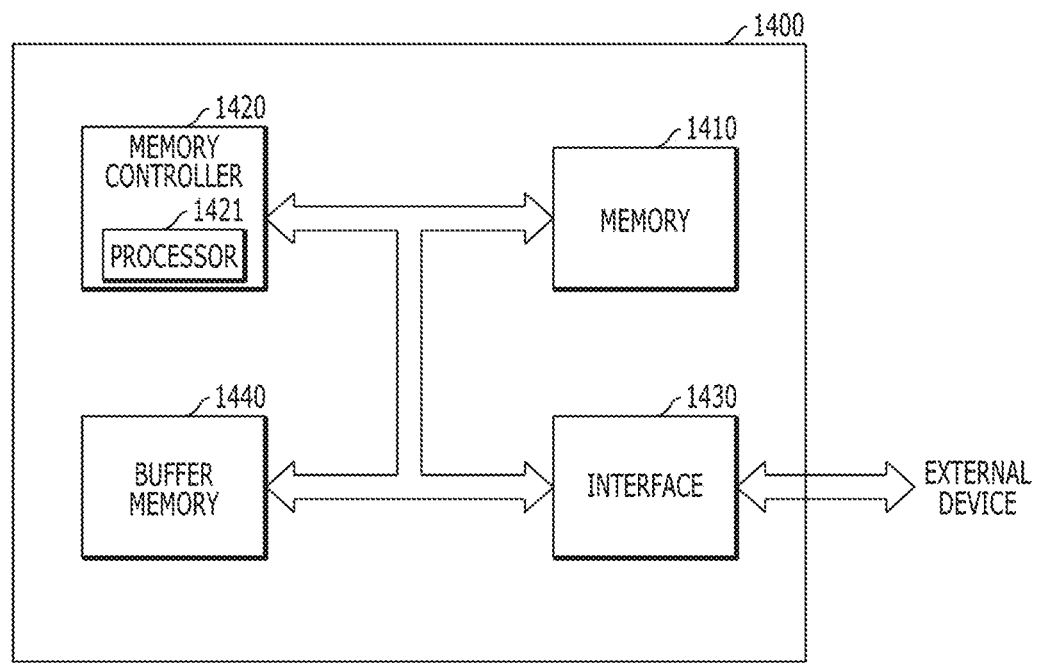
FIG. 10 is an example of configuration diagram of a memory system implementing memory circuitry based on the disclosed technology.

FIG. 10 is an example of configuration diagram of a memory system implementing memory circuitry based on the disclosed technology.

Referring to FIG. 10, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a variable resistance element exhibiting two different states for storing data; and an upper layer disposed over the variable resistance element, and wherein the upper layer may have a stepped or sloped profile and be located to serve as a part of a hard mask to pattern the variable resistance element. Through this, data storage characteristics of the memory 1410 may be improved. As a consequence, operating characteristics and data storage characteristics of the memory system 1400 may be improved.

Also, the memory 1410 according to this implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to this implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a variable resistance element exhibiting two different states for storing data; and an upper layer disposed over the variable resistance element, and wherein the upper layer may have a stepped or sloped profile and be located to serve as a part of a hard mask to pattern the variable resistance element. Through this, data storage characteristics of the buffer memory 1440 may be improved. As a consequence, operating characteristics and data storage characteristics of the memory system 1400 may be improved.

Moreover, the buffer memory 1440 according to this implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 6-10 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory,
    wherein the semiconductor memory comprises:
    a variable resistance element exhibiting two different states for storing data; and
    an upper layer disposed over the variable resistance element,
    wherein the upper layer has a stepped profile and includes an upper portion and a lower portion having a wider width than the upper portion,
    wherein sidewalls of the upper portion and sidewalls of the lower portion are configured to be discontinuous from each other, and
    wherein a height of the upper portion is higher than a height of the lower portion.

2. The electronic device of claim 1, wherein the upper layer includes a material having a high etching selectivity.

3. The electronic device of claim 1, wherein the upper layer includes a single-layer or multilayer structure including a metal, a nitride, or an oxide, or a combination thereof.

4. The electronic device of claim 1, wherein the upper layer includes ruthenium (Ru).

5. The electronic device of claim 1,
    wherein the variable resistance element includes an MTJ (Magnetic Tunnel Junction) structure including a free layer having a variable magnetization direction, a pinned layer having a fixed magnetization direction, and a tunnel barrier layer interposed between the free layer and the pinned layer, and
    wherein the upper layer is disposed over the MTJ structure and includes a capping layer having the stepped profile.

6. The electronic device of claim 5,
    wherein the capping layer includes an upper portion and a lower portion having a wider width than the upper portion,
    and
    wherein the semiconductor memory further includes a top electrode disposed over the upper portion of the capping layer and having a smaller width than the upper portion.

7. The electronic device according to claim 1, further comprising a microprocessor which includes:
    a control unit configured to receive a signal including a command from an outside of the microprocessor, and performs extracting, decoding of the command, or controlling input or output of a signal of the microprocessor;
    an operation unit configured to perform an operation based on a result that the control unit decodes the command; and
    a memory unit configured to store data for performing the operation, data corresponding to a result of performing the operation, or an address of data for which the operation is performed,
    wherein the semiconductor memory is part of the memory unit in the microprocessor.

8. The electronic device according to claim 1, further comprising a processor which includes:
    a core unit configured to perform, based on a command inputted from an outside of the processor, an operation corresponding to the command, by using data;
    a cache memory unit configured to store data for performing the operation, data corresponding to a result of performing the operation, or an address of data for which the operation is performed; and
    a bus interface connected between the core unit and the cache memory unit, and configured to transmit data between the core unit and the cache memory unit,
    wherein the semiconductor memory is part of the cache memory unit in the processor.

9. The electronic device according to claim 1, further comprising a processing system which includes:
    a processor configured to decode a command received by the processor and control an operation for information based on a result of decoding the command;
    an auxiliary memory device configured to store a program for decoding the command and the information;
    a main memory device configured to call and store the program and the information from the auxiliary memory device such that the processor can perform the operation using the program and the information when executing the program; and
    an interface device configured to perform communication between at least one of the processor, the auxiliary memory device and the main memory device and the outside,
    wherein the semiconductor memory is part of the auxiliary memory device or the main memory device in the processing system.

10. The electronic device according to claim 1, further comprising a data storage system which includes:
    a storage device configured to store data and conserve stored data regardless of power supply;
    a controller configured to control input and output of data to and from the storage device according to a command inputted from an outside;

a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

11. The electronic device according to claim 1, further comprising a memory system which includes:

a memory configured to store data and conserve stored data regardless of power supply;

a memory controller configured to control input and output of data to and from the memory according to a command inputted from an outside;

a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

12. An electronic device comprising a semiconductor memory wherein the semiconductor memory comprises:

a variable resistance element exhibiting two different states for storing data; and an upper layer disposed over the variable resistance element, wherein the upper layer has a stepped profile and includes an upper portion and a lower portion having a wider width than the upper portion, and wherein sidewalls of the upper portion and sidewalls of the lower portion are configured to be discontinuous from each other, wherein the variable resistance element includes an MTJ (Magnetic Tunnel Junction) structure including a free layer having a variable magnetization direction, a pinned layer having a fixed magnetization direction, and a tunnel barrier layer interposed between the free layer and the pinned layer, and wherein the upper layer is disposed over the MTJ structure and includes a capping layer having the stepped profile, wherein the capping layer has an upper portion and a lower portion having a wider width than the upper portion, wherein a height of the upper portion is higher than a height of the lower portion, and wherein the semiconductor memory further includes, a magnetic correction layer disposed over the MTJ structure and operable to offset or reduce an influence of a stray field produced by the pinned layer;

a spacer layer interposed between the magnetic correction layer and the pinned layer and operable to function as a buffer between the magnetic correction layer and the pinned layer;

an under layer disposed below the MTJ structure and operable to improve perpendicular magnetic anisotropy of the free layer; and a buffer layer disposed below the under layer and operable to aid in crystal growth of the under layer, and wherein the magnetic correction layer, the spacer layer, the pinned layer, the tunnel barrier layer, the free layer, the under layer and the buffer layer have sidewalls which are aligned with the lower portion of the capping layer, and the magnetic correction layer, the spacer layer, the pinned layer, the tunnel barrier layer, the free layer, the under layer and the buffer layer have sidewalls which are not aligned with the upper portion of the capping layer.

13. An electronic device comprising a semiconductor memory, wherein the semiconductor memory comprises:

a variable resistance element exhibiting two different states for storing data; and an upper layer disposed over the variable resistance element, wherein the upper layer has a stepped profile and includes an upper portion and a lower portion having a wider width than the upper portion, wherein sidewalls of the upper portion and sidewalls of the lower portion are configured to be discontinuous from each other, wherein the variable resistance element includes an MTJ (Magnetic Tunnel Junction) structure including a free layer having a variable magnetization direction, a pinned layer having a fixed magnetization direction, and a tunnel barrier layer interposed between the free layer and the pinned layer, wherein the upper layer is disposed over the MTJ structure and includes a capping layer having the stepped profile, wherein the capping layer includes an upper portion and a lower portion having a wider width than the upper portion, wherein a height of the upper portion is higher than a height of the lower portion, wherein the semiconductor memory further includes a top electrode disposed over the upper portion of the capping layer and having a smaller width than the upper portion, and, wherein the semiconductor memory further includes, a magnetic correction layer disposed over the MTJ structure and operable to offset or reduce an influence of a stray field produced by the pinned layer;

a spacer layer interposed between the magnetic correction layer and the pinned layer and operable to function as a buffer therebetween;

an under layer disposed below the MTJ structure and operable to improve perpendicular magnetic anisotropy of the free layer; and a buffer layer disposed below the under layer and operable to aid in crystal growth of the under layer, and wherein the magnetic correction layer, the spacer layer, the pinned layer, the tunnel barrier layer, the free layer, the under layer and the buffer layer have sidewalls which are not aligned with the top electrode.

* * * * *